United States Patent [19]

Akagiri et al.

[11] Patent Number: 4,521,738
[45] Date of Patent: Jun. 4, 1985

[54] GAIN CONTROL CIRCUIT

[75] Inventors: Kenzo Akagiri; Masayuki Katakura, both of Kanagawa, Japan

[73] Assignee: Sony Corporation, Tokyo, Japan

[21] Appl. No.: 534,509

[22] Filed: Sep. 21, 1983

Related U.S. Application Data

[63] Continuation of Ser. No. 246,392, Mar. 23, 1981, Pat. No. 4,422,049.

[30] Foreign Application Priority Data

Mar. 24, 1980 [JP] Japan ................................. 55-37112

[51] Int. Cl.³ .............................................. H03G 7/00
[52] U.S. Cl. .................................. 330/134; 330/141; 330/281; 333/14
[58] Field of Search ................ 330/134, 141, 281; 333/14; 455/244

[56] References Cited

U.S. PATENT DOCUMENTS

| | | | |
|---|---|---|---|
| 3,770,984 | 11/1973 | Connor et al. | 307/237 |
| 3,790,896 | 2/1974 | Shimizu et al. | 330/141 X |
| 3,807,816 | 4/1974 | Hamburg | 328/143 |
| 3,848,194 | 11/1974 | Nishimura et al. | 330/86 X |
| 4,250,471 | 2/1981 | Duncan | 333/14 |

FOREIGN PATENT DOCUMENTS

| | | |
|---|---|---|
| 2167963 | 8/1973 | France . |
| 640920 | 8/1950 | United Kingdom . |
| 642731 | 9/1950 | United Kingdom . |
| 961131 | 6/1964 | United Kingdom . |
| 1172310 | 11/1969 | United Kingdom . |
| 1424082 | 2/1976 | United Kingdom . |

Primary Examiner—James B. Mullins
Attorney, Agent, or Firm—Lewis H. Eslinger; Alvin Sinderbrand

[57] ABSTRACT

A gain control circuit, which has particular utility in a compressor or expander of a noise reduction circuit, is comprised of first and second detectors for detecting the output signal from a variable gain amplifier and providing respective detector outputs for charging first and second capacitors, respectively. Such first and second capacitors have discharge paths in which first and second resistors are respectively interposed, and the charge on the first capacitor is employed as a control signal for determining the gain of the variable gain amplifier. Further, the first resistor is connected between the first and second capacitors so that the discharge current through the first resistor is dependent on the difference between the charge voltages on the first and second capacitors, whereby a relatively long recovery time can be obtained without adversely affecting the attack time even when the input signal to the variable gain amplifier is of low level.

19 Claims, 9 Drawing Figures

GAIN CONTROL CIRCUIT

This is a continuation of application Ser. No. 246,392 filed Mar. 23, 1981, and now U.S. Pat. No. 4,422,049.

BACKGROUND OF THE INVENTION

1. Field of the Invention

This invention relates generally to gain control circuits, and more particularly is directed to AGC circuits (automatic gain control circuits) having utility in compressors or expanders of noise reduction circuits.

2. Description of the Prior Art

Gain control circuits are known in which the gain of a variable gain amplifier is automatically controlled by a gain control signal so as to decrease or increase the gain upon an increase or decrease, respectively, in the level of an input signal applied to the amplifier. In existing automatic gain control circuits, as aforesaid, a detector senses the output signal from the variable gain amplifier and provides a detector output coupled, through a two-stage RC circuit, to a control terminal of the amplifier. The two-stage RC circuit includes a first resistor and a first capacitor connected, in parallel between the detector output and ground, a diode and a second resistor connected, in parallel, between the output side of the first capacitor and the control terminal of the variable gain amplifier, and a second capacitor connected between such control terminal and ground. In the operation of the foregoing gain control circuit, in the case of its recovery mode, for example, when the input signal to the variable gain amplifier changes suddenly from a high level to a low level, the first and second capacitors, which have been previously changed by the relatively high output of the detector, are discharged in sequence through the first and second resistors in response to the reduction of the detector output. More particularly, when the level of the input signal to the variable gain amplifier suddenly decreases, the control signal for varying the gain of the amplifier is changed only gently for a period of time and, thereafter, the control signal is quickly reduced to increase the gain of the amplifier and quickly restore the level of the output signal therefrom. In the attack mode of the described known gain control circuits, that is, when the level of the input signal to the variable gain amplifier is quickly increased, it is intended that the diode is made conductive by the increase of the detector output so that the second capacitor is quickly charged to similarly increase the control signal and thereby achieve a fast attack time.

However, such fast attack time is achieved, with the prior art gain control circuit, only when the input signal is increased suddenly from a substantial initial level. In other words, if there is a rapid increase in the input signal from a low level, then it is likely that the output voltage from the detector will be too low to make the diode conductive and, in such case, the second capacitor will be charged relatively slowly through the second resistor. Therefore, with the described prior art gain control circuit, in the case of a relatively low level input signal, the attack time may be as slow as several hundred msec. Such a slow attack time will result in overshoots in the output signal from the variable gain amplifier and limitations are thereby imposed on the applications of the described prior art gain control circuit.

OBJECTS AND SUMMARY OF THE INVENTION

Accordingly, it is an object of the present invention to provide improved gain control circuits which avoid the above-described disadvantages and difficulties of the prior art, and which are relatively simple in construction and inexpensive to produce.

More particularly, it is an object of this invention to provide a gain control circuit which can be used in a compressor or expander of a noise reduction circuit.

It is another object of this invention to provide a gain control circuit having a substantial recovery time, for example, about 10 msec., and a fast attack time for example, of about several hundred $\mu$sec., even when the input signal has a low level.

In accordance with an aspect of the present invention, a gain control circuit includes a variable gain amplifier, and control means for controlling the gain of such amplifier and which comprises first and second detectors for detecting the output signal from the variable gain amplifier and providing respective first and second detector outputs, first and second capacitors charged by such first and second detector outputs, respectively, and first and second resistors connected for the discharge therethrough of the first and second capacitors, respectively, with the charge on the first capacitor being applied to the variable gain amplifier as a control signal for the latter, and with the first resistor being connected between the first and second capacitors so that the difference between the charges on the capacitors is applied across the first resistor.

The above, and other objects, features and advantages of the present invention, will be readily apparent from the following detailed description of illustrative embodiments of the invention which is to be read in connection with the accompanying drawings.

DETAILED DESCRIPTION OF THE PREFERRED EMBODIMENTS

Figure 1:
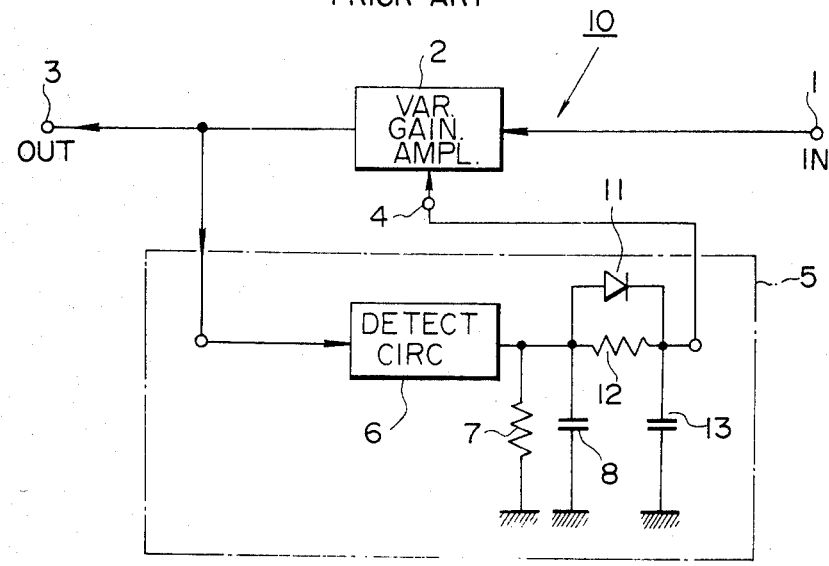
FIG. 1 is a circuit diagram showing a gain control circuit according to the prior art.

In order that the problems solved by the present invention may be fully understood, reference will first be made to a gain control circuit 10 according to the prior art which is shown in FIG. 1 to include an input terminal 1 from which an input signal is supplied to a variable gain amplifier 2 having an output terminal 3 for delivering the amplified signal and a control terminal 4 for receiving, from a control circuit 5, a control signal by which the gain of amplifier 2 is suitably varied. More particularly, the control signal from circuit 5 is effective to increase or decrease the gain of amplifier 2 upon a decrease or increase, respectively, in the level of the input signal applied to terminal 1. In the illustrated control circuit 5, a detector 6 detects the output signal from amplifier 2 and provides a detector output which is coupled through a two-stage RC circuit to control terminal 4. Such two-stage RC circuit is shown to include a first resistor 7 and a first capacitor 8 connected, in parallel, between the output of detector 6 and ground, a diode 11 and a second resistor 12 connected, in parallel, between the output side of capacitor 8, that is, the side of the latter connected to the output of detector 6, and control terminal 4, and a second capacitor 13 connected between control terminal 4 and ground.

Figure 2:
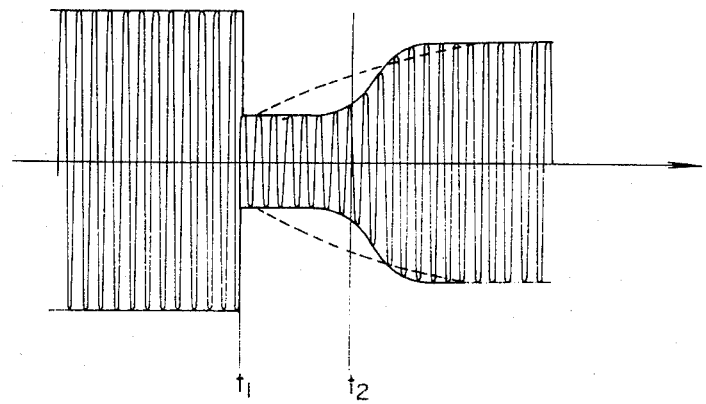
FIG. 2 is a graph showing variations, with time, of the output signal from the gain control circuit of FIG. 1 in the recovery mode thereof.

In the operation of the gain control circuit 10 according to the prior art, capacitors 8 and 13 are charged by the output of detector 6 in response to the output signal from amplifier 2. In the event of a sudden change of the input signal applied to terminal 1 from a high level to a low level, that is, in the recovery mode of gain control circuit 10, the output of detector 6 is reduced to signal the reduction in the level of the output signal from amplifier 2, and capacitors 8 and 13 are discharged through resistors 7 and 12 upon the reduction of the output of detector 6. However, in such discharging of capacitors 8 and 13, capacitor 8 is first discharged through resistor 7 to ground, and capacitor 13 is discharged through resistor 12 and resistor 7 to ground only after capacitor 8 has been discharged to a predetermined extent. It will be appreciated that, until capacitor 8 is discharged to such predetermined extent, the terminal voltage across resistor 12 will be low and the discharge current from capacitor 13 through resistor 12 will be correspondingly low. Thus, the control voltage applied to control terminal 4 is only gently or gradually reduced until capacitor 8 has been discharged beyond the predetermined extent, whereupon capacitor 13 is relatively quickly discharged for similarly reducing the control signal applied to terminal 4 of amplifier 2. Thus, by way of example, and as shown on FIG. 2, if the level of the input signal applied to terminal 1 of gain control circuit 10 according to the prior art is suddenly reduced at the time $t_1$, the output signal from terminal 3 is only gently or gradually restored by a correspondingly gentle or gradual increase in the gain of amplifier 2 until, at the time $t_2$ which is a predetermined period after the time $t_1$, the control voltage applied by circuit 5 to terminal 4 is quickly reduced to rapidly increase the gain of amplifier 2 and thereby similarly rapidly restore the output signal. If a single-stage RC circuit is used between the output of detector 6 and control terminal 4 in place of the two-stage RC circuit of FIG. 1, the level of the output signal from amplifier 2 will change exponentially, as indicated by the broken line curve on FIG. 2, in the recovery mode of the gain control circuit.

In the attack mode of the gain control circuit 10 of FIG. 1, that is, when the level of the input signal applied to terminal 1 is quickly increased, it is intended that the diode 11 should be made conductive by the resulting increase in the output voltage of detector 6, with the result that capacitor 13 is quickly charged through conductive diode 11 for effecting a correspondingly quick decrease in the gain of amplifier 2, that is, for obtaining a fast attack time. However, if the quick increase in the level of the input signal applied to terminal 1 occurs from a low initial signal level, it is likely that the resulting output voltage from detector 6 will not be sufficiently high to cause diode 11 to become conductive. In such case, capacitor 13 can be charged only relatively slowly through resistor 12 in response to the increased output voltage of detector 6. Therefore, with the gain control circuit according to the prior art, as shown on FIG. 1, in the case of a low level input signal, the attack time will be relatively slow, for instance on the order of several hundred msec., which would result in overshoots in the output signal, thereby limiting the possible applications of the described circuit 10 particularly in respect to the utility thereof in a compressor or expander of a noise reduction circuit.

Figure 3:
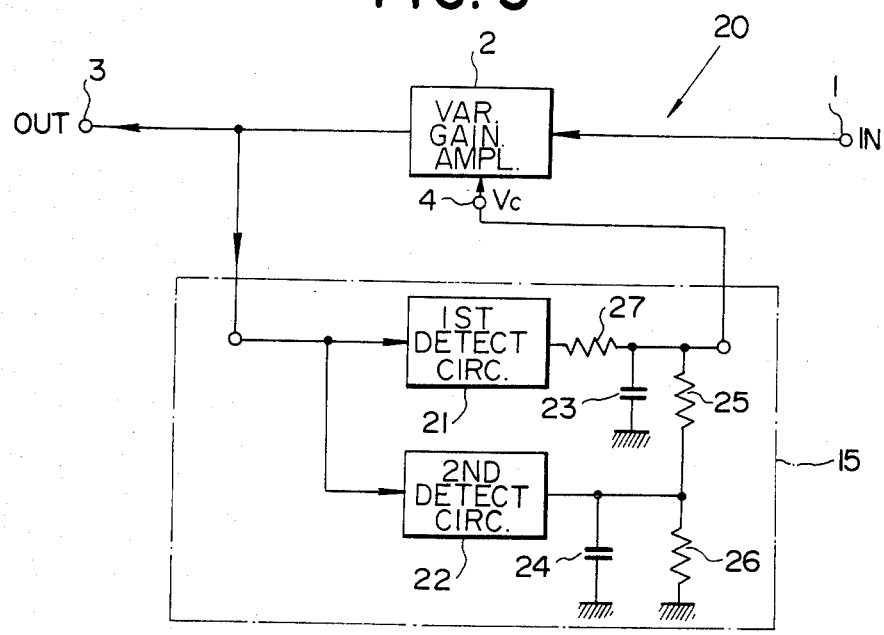
FIG. 3 is a circuit diagram, similar to that of FIG. 1, but showing an embodiment of the present invention.

Referring now to FIG. 3, it will be seen that a gain control circuit 20 according to an embodiment of the present invention, as there illustrated, has its components which correspond to those described previously with reference to FIG. 1 identified by the same reference numerals. The variable gain amplifier 2 of such gain control circuit 20 may be a VCA (voltage controlled amplifier) or any other well known amplifier circuit which need not be described in detail, and which has its gain varied in response to the voltage of a control signal $v_c$ applied to control terminal 4 from a control circuit 15. If gain control circuit 20 is used as an AGC (automatic gain control) circuit or a compressor in a noise reduction system, amplifier 2 is suitably arranged so that its gain G is related to the control voltage $v_c$ obtained by rectifying and smoothing the output signal from terminal 3 in accordance with the equation:

$$G = k/v_c$$

or $$G = Ke^{-v_c}.$$

Thus, automatic gain control or signal compression function is obtained with the gain G being decreased or increased upon an increase or decrease, respectively, in the level of the signal applied to input terminal 1.

In the control circuit 15 according to this invention, as illustrated on FIG. 3, the output signal from terminal 3 of gain control circuit 20 is detected by first and second detector circuits 21 and 22. The control circuit 15 is further shown to include first and second capacitors 23 and 24 and first and second resistors 25 and 26. More particularly, the output from the first detector circuit 21 is shown to be coupled through an additional resistor 27 to control terminal 4 of amplifier 2, and the juncture between resistor 27 and control terminal 4 is connected to one side of first capacitor 23 which has its other side connected to ground. The first resistor 25 is connected in parallel with capacitor 23 to the juncture between resistor 27 and terminal 4 so that the first capacitor 23 is charged by the output of first detector circuit 21 and discharged through first resistor 25, and further so that the charge on first capacitor 23 constitutes the control voltage or signal $v_c$ applied to terminal 4 for determining the gain of amplifier 2. One side of second capacitor 24 is connected to the output of second detector circuit 22 while the other side of capacitor 24 is connected to ground so that capacitor 24 is chargeable by the output of detector circuit 22. The second resistor 26 is connected in parallel with second capacitor 24 so that the latter can be discharged to ground through second resistor 26.

First capacitor 23 and first resistor 25 function as a first smoothing circuit for smoothing the output of first detector circuit 21, and the output of such first smoothing circuit obtained at the side of capacitor 23 connected to detector circuit 21, that is, the non-grounded or output side of capacitor 23, is connected to control terminal 4. Similarly, second capacitor 24 and second resistor 26 form a second smoothing circuit for smoothing the output of second detector circuit 22, and the output of such second smoothing circuit obtained at the non-grounded or output side of second capacitor 24 is connected to the end of first resistor 25 remote from the end thereof connected to capacitor 23. In other words, the first resistor 25 is connected between the output sides of capacitors 23 and 24 which are connected to the outputs of detector circuits 21 and 22, respectively. By reason of the foregoing, the discharge time constant of first capacitor 23 is varied in accordance with the output of second detector circuit 22.

If it is desired to avoid the occurrence of a large transient current through detector circuit 22, a resistor (not shown) may be connected between the output of detector circuit 22 and the juncture of capacitor 24 and resistor 26 similarly to the resistor 27 connected between the output of detector circuit 21 and the juncture of capacitor 23 and resistor 25.

The detector circuits 21 and 22 are preferably active detector circuits. For example, the detector circuits 21 and 22 of the control circuit 15 illustrated on FIG. 3 may be constructed similarly to the first and second detector circuits 31 and 32 illustrated in FIG. 4. More particularly, each of the active detector circuits 31 and 32 is shown on FIG. 4 to include an operational amplifier 33 having a positive input connected to receive the output signal from variable gain amplifier 2, a negative input and an output from the operational amplifier, a diode 34 connected to the output of operational amplifier 33, and a negative feedback path from the output of diode 34 to the negative input of operational amplifier 33. Further, as in the embodiment of the invention shown on FIG. 4, the control circuit 15 may desirably include a buffer amplifier 35 connected between the output of detector circuit 32 and first resistor 25.

Figure 4:
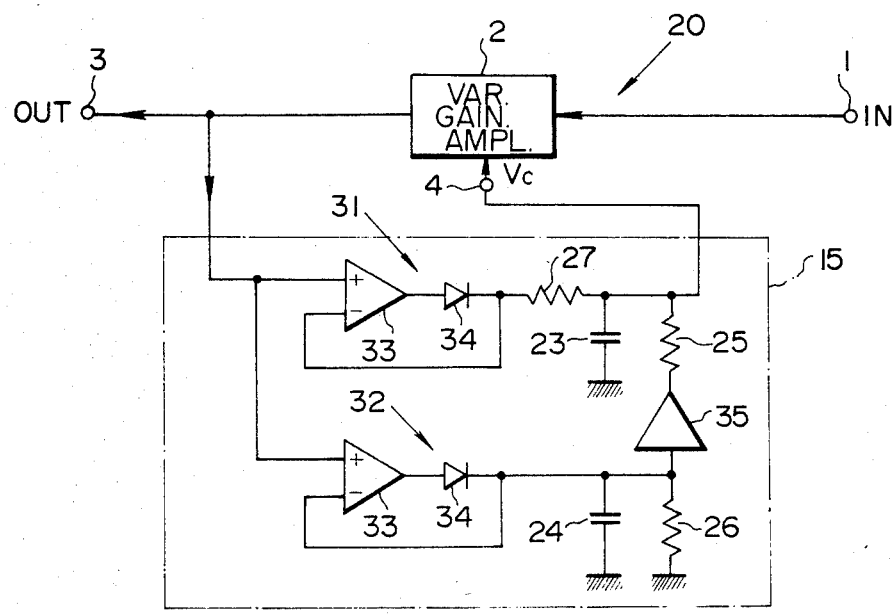
FIG. 4 is a circuit diagram showing another embodiment of the present invention, and further showing details of detector circuits that may be used in gain control circuits according to the invention.
Figure 5:
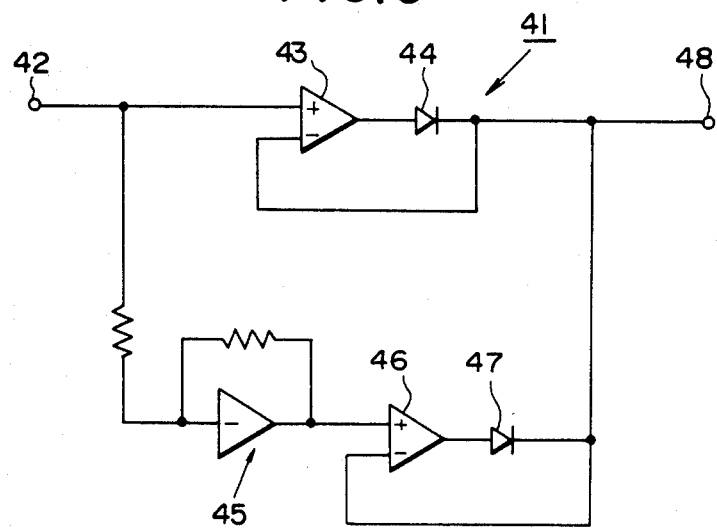
FIG. 5 is a circuit diagram showing details of another form of detector circuit that may be desirably used in gain control circuits embodying the present invention.

Referring now to FIG. 5, it will be seen that a detector circuit 41 of a full-wave rectifying type which may be desirably employed for each of the detector circuits 21 and 22 on FIG. 3 or in place of each of the detector circuits 31 and 32 on FIG. 4 includes an operational amplifier 43 and diode 44 connected to each other in the same manner as the operational amplifier 33 and diode 34 on FIG. 4, with the positive input of amplifier 43 being connected to a terminal 42 which receives the output signal from a variable gain amplifier, for example, the amplifier 2 on FIG. 3 or FIG. 4. The output signal applied to terminal 42 from a variable gain amplifier is also supplied through an inverter 45 to a positive input of another operational amplifier 46, and a diode 47 is connected to the output of operational amplifier 46 and has its output, in turn, applied as a negative feedback to a negative input of operational amplifier 46. The outputs of diodes 44 and 47 are further shown to be connected together to a terminal 48 which is connected either through resistor 27 to the non-grounded side of capacitor 23 or to the non-grounded side of capacitor 24, as shown on FIGS. 3 and 4.

In the operation of a gain control circuit 20 according to the present invention, capacitors 23 and 24 are charged by the outputs of detector circuits 21 and 22 or 31 and 32, respectively, in response to the output signal from amplifier 2. In the event of a sudden change of the input signal applied to terminal 1, for example, from a high level to a low level, that is, in the recovery mode of gain control circuit 20, the outputs of detector circuits 21 and 22 or 31 and 32 are reduced to signal the reduction in the level of the output signal from amplifier 2, and capacitors 23 and 24 are discharged through resistors 25 and 26 and resistor 26, respectively. However, in such discharging of capacitors 23 and 24, first capacitor 23 is discharged through first resistor 25 and second resistor 26 only after substantial discharge of second capacitor 24 through second resistor 26. The foregoing proceeds from the fact that the voltage or charge on second capacitor 24 is applied to the end of resistor 25 connected through resistor 26 to ground. Thus, the terminal voltage across resistor 25 is initially low, with the result that the discharge current from capacitor 23 through resistor 25 is initially very small so as to cause a gentle decrease in the control signal voltage $v_c$ applied from capacitor 23 to control terminal 4. However, as capacitor 24 is progressively discharged, the terminal voltage across resistor 25 is increased for correspondingly increasing the discharge current from capacitor 23 and thereby quickly reducing the control voltage $v_c$ applied to terminal 4 and correspondingly quickly increasing the gain of amplifier 2.

Figure 6A:
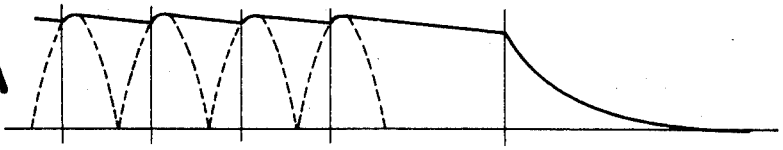
FIGS. 6A–6C are waveform diagrams to which reference will be made in explaining the operation of the gain control circuit shown in FIG. 3.
Figure 6B:
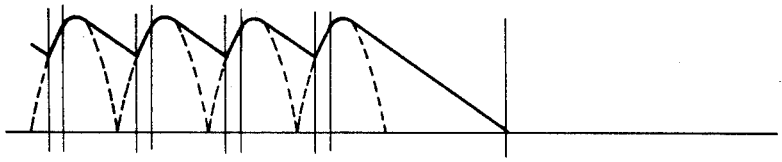
Figure 6C:
Figure 7:
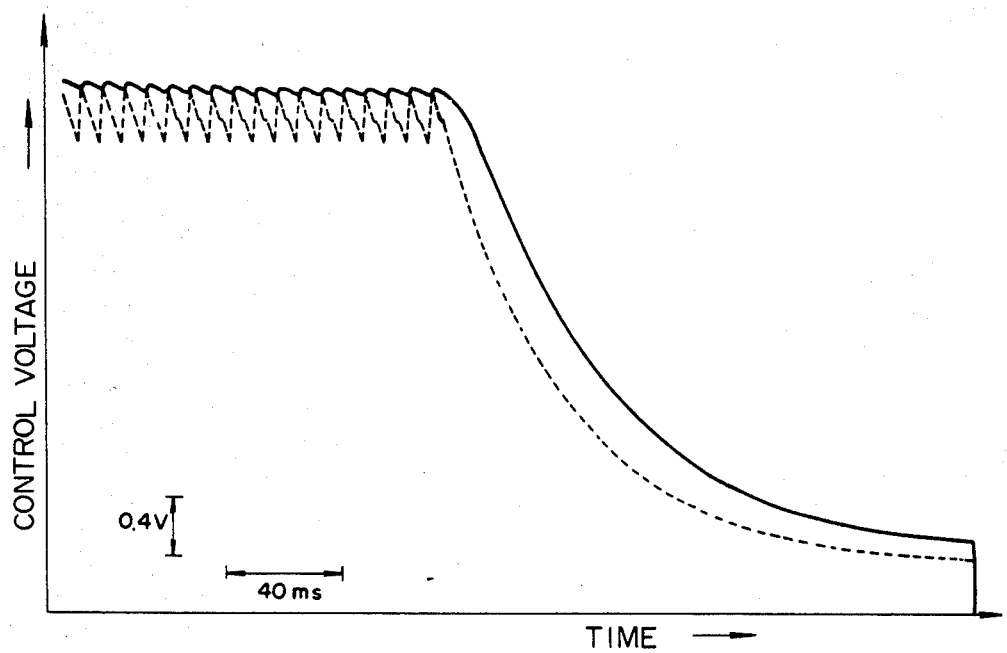
FIG. 7 is a graph illustrating variations of the control voltage with time in a gain control circuit according to this invention, and to which reference will also be made in explaining the operation of such circuit.

If the full-wave rectifying detector circuit 41 of FIG. 5 is used for each of the detector circuits 21 and 22 of FIG. 3, then the outputs of such detector circuits 21 and 22 are substantially represented by the broken line curves on FIGS. 6A and 6B, respectively, and the voltages or charges on the first and second capacitors 23 and 24 are represented by the curves in solid lines on FIGS. 6A and 6B, respectively. In such case, the terminal voltage across resistor 25 is the difference between the voltages indicated by the solid line curves on FIGS. 6A and 6B, and is represented by the curve shown on FIG. 6C. Referring now to FIG. 7, it is to be noted that the curve shown in solid lines thereon represents the control voltage $v_c$ applied from control circuit 15 to terminal 4 of variable gain amplifier 2 when a tone burst signal having a carrier frequency of 100 Hz is supplied to control circuit 15, and when the time constant of the RC parallel circuit comprised of first capacitor 23 and first resistor 25 is 100 msec. and the time constant of the RC parallel circuit comprised of second capacitor 24 and second resistor 26 is 20 msec. The curve shown in broken lines on FIG. 7 is given by way of reference and represents the control voltage obtained from control circuit 15 in the event that the second capacitor 24 and second resistor 26 are omitted.

It will be seen from FIG. 7 that, in the gain control circuits 20 according to this invention, control signal ripple is extremely small even when the input signal frequency is as low as about 100 Hz, so that it is possible to obtain steady gain control free from waveform distortions. Further, the recovery time can be relatively short, typically on the order of 100 msec., which is comparable with that obtained when using, a single-stage RC circuit.

Further, in the attack mode, the outputs of detector circuits 21 and 22 or 31 and 32 quickly charge the respective capacitors 23 and 24, so that the attack time is determined substantially by the time constant of the circuit comprised of resistor 27 and capacitor 23, which time constant can be readily made very short, for example, on the order of 300 to 500 μsec. Moreover, in the attack mode, the operating characteristics are determined solely by the RC circuit elements associated with the first detector circuit 21 or 31 so that normal operation can be ensured in the attack mode even when a low level signal is being applied to input terminal 1.

When a buffer amplifier is employed in the connection of the first resistor 25 to the second capacitor 24, as at 35 on FIG. 4, such buffer amplifier serves to prevent the flow into second capacitor 24 of the discharge current flowing from first capacitor 23 through first resistor 25 when the output voltage of the second capacitor 24 has been reduced. Thus, buffer amplifier 35 prevents unnecessary extension of the recovery time of the gain control circuit.

It will be appreciated from the foregoing that, in accordance with the present invention, it is possible to provide gain control circuits which eliminate the described disadvantages of the prior art, such as extension of the attack time and limitations upon the input level range. Further, gain control circuits according to this invention are seen to be substantially free of ripple even when an input signal of a low frequency is applied, and such gain control circuits are further able to have a recovery time as short as about 100 msec.

Although illustrative embodiments of the invention have been described in detail herein with reference to the accompanying drawings, it is to be understood that the invention is not limited to those precise embodiments and that various changes and modifications may be effected therein by one skilled in the art without departing from the scope or spirit of the invention as defined in the appended claims.

What is claimed is:

1. A gain control circuit including variable gain amplifier means having input, output and control terminals, and control means for generating a control signal applied to said control terminal for controlling the gain with which said variable gain amplifier means amplifies an input signal applied to said input terminal for providing an output signal to said output terminal, said control means comprising:

first detector means for detecting a signal passed through the amplifier means and providing a first detector output representative of the level of said signal passed through the amplifier means;

second detector means for detecting said signal passed through the amplifier means and providing a second detector output representative of the level of said signal passed through the amplifier means;

first and second capacitors respectively connected at one side thereof to said first and second detector means and at the other side thereof to ground so as to be chargeable by said first and second detector outputs, respectively;

said one side of said first capacitor being connected with said control terminal of the variable gain amplifier means so that the charge on said first capacitor constitutes said control signal;

a first resistor connected between said one sides of said first and second capacitors; and a second resistor connected with said one side of said second capacitor for the discharge of said second capacitor through said second resistor and for the discharge of said first capacitor through said first and second resistors only after substantial discharge of said second capacitor through said second resistor so that the discharge time constant of said first capacitor is varied in accordance with said second detector output.

2. A gain control circuit according to claim 1; further comprising means for providing said first capacitor with a charge time constant which is larger than the charge time constant of said second capacitor.

3. A gain control circuit according to claim 2; in which said means providing said first capacitor with said longer charge time constant include an additional resistor connected between said first detector output and said one side of said first capacitor.

4. A gain control circuit according to claim 3; in which buffer amplifier means are connected between said first resistor and said one side of the second capacitor.

5. A gain control circuit according to claim 4, in which each of said first and second detector means includes an operational amplifier having a positive input connected to receive said output signal from the variable gain amplifier means, a negative input and an output from said operational amplifier, diode means connected to said output of the operational amplifier, and a negative feedback path from the output of said diode means to said negative input of the operational amplifier.

6. A gain control circuit according to claim 5; in which each of said first and second detector means includes another operational amplifier having positive and negative inputs and an output, inverter means through which said output signal from the variable gain amplifier means is applied to said positive input of said other operational amplifier, another diode means connected to said output of said other operational amplifier, and a negative feedback path from the output of said other diode means to said negative input of said other operational amplifier, said output of the other diode means being connected in parallel with the output of the first mentioned diode means to constitute the respective detector output.

7. A gain control circuit according to claim 1; further comprising buffer amplifier means connected between said first resistor and said one side of the second capacitor.

8. A gain control circuit according to claim 1; in which each of said first and second detector means includes an operational amplifier having a positive input connected to receive said output signal from the variable gain amplifier means, a negative input and an output from said operational amplifier, diode means connected to said output of the operational amplifier, and a negative feedback path from the output of said diode means to said negative input of the operational amplifier.

9. A gain control circuit according to claim 8; in which each of said first and second detector means includes another operational amplifier having positive and negative inputs and an output, inverter means through which said output signal from the variable gain amplifier means is applied to said positive input of said other operational amplifier, another diode means connected to said output of said other operational amplifier, and a negative feedback path from the output of said other diode means to said negative input of said other operational amplifier, said output of the other diode means being connected in parallel with the output of the first mentioned diode means to constitute the respective detector output.

10. A gain control circuit according to claim 1; in which said first and second detector means detect said output signal from said amplifier means.

11. A gain control circuit according to claim 1; in which the discharge time constant of said first capacitor is longer than the discharge time constant of said second capacitor.

12. A gain control circuit including variable gain amplifier means having input, output and control terminals, and control means for generating a control signal applied to said control terminal for controlling the gain with which said variable gain amplifier means amplifies an input signal applied to said input terminal for providing an output signal terminal, said control means comprising:

first detector means for detecting a signal passed through the amplifier means and providing a first detector output representative of the level of said signal passed through the amplifier means;

second detector means for detecting said signal passed through the amplifier means and providing a second detector output representative of the level of said signal passed through the amplifier means;

first smoothing circuit means for smoothing said first detector output and including (i) a first capacitor having one side connected to said first detector output and the other side connected to ground and (ii) a first resistor, said first smoothing circuit means having an output constituting the charge on said first capacitor, said charge being applied to said control terminal as said control signal; and second smoothing circuit means for smoothing said second detector output and including (i) a second capacitor having one side connected to said second detector output and the other side connected to ground and (ii) a second resistor, said first resistor being connected between said one sides of said first and second capacitors and said second smoothing circuit having an output applied to one end of said first resistor for the discharge of said first capacitor through said first and second resistors only after substantial discharge of said second capacitor through said second resistor so that the discharge time constant of said first capacitor is varied in accordance with said second detector output.

13. A gain control circuit according to claim 12; further comprising means for providing said first capacitor with a charge time constant which is larger than the charge time constant of said second capacitor.

14. A gain control circuit according to claim 13; in which said means providing said first capacitor with said longer charge time constant include an additional resistor connected between said first detector output and said one side of said first capacitor.

15. A gain control circuit according to claim 12; further comprising buffer amplifier means connected between said one end of said first resistor and said second capacitor.

16. A gain control circuit according to claim 12; in which each of said first and second detector means includes an operational amplifier having a positive input connected to receive said output signal from the variable gain amplifier means, a negative input and an output from said operational amplifier, diode means connected to said output of the operational amplifier, and a negative feedback path from the output of said diode means to said negative input of the operational amplifier.

17. A gain control circuit according to claim 16; in which each of said first and second detector means includes another operational amplifier having positive and negative inputs and an output, inverter means through which said output signal from the variable gain amplifier means is applied to said positive input of said other operational amplifier, another diode means connected to said output of said other operational amplifier, and a negative feedback path from the output of said other diode means to said negative input of said other operational amplifier, said output of the other diode means being connected in parallel with the output of the first mentioned diode means to constitute the respective detector output.

18. A gain control circuit according to claim 12; in which said first and second detector means detect said output signal from said amplifier means.

19. A gain control circuit according to claim 11; in which the discharge time constant of said first capacitor is longer than the discharge time constant of said second capacitor.

* * * * *